US009252298B2

(12) United States Patent
Teva

(10) Patent No.: US 9,252,298 B2
(45) Date of Patent: Feb. 2, 2016

(54) PHOTODIODE DEVICE WITH REDUCIBLE SPACE CHARGE REGION

(71) Applicant: ams AG, Unterpremstaetten (AT)

(72) Inventor: Jordi Teva, Veldhoven (NL)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/430,534

(22) PCT Filed: Sep. 10, 2013

(86) PCT No.: PCT/EP2013/068741
§ 371 (c)(1),
(2) Date: Mar. 23, 2015

(87) PCT Pub. No.: WO2014/048730
PCT Pub. Date: Apr. 3, 2014

(65) Prior Publication Data
US 2015/0287847 A1    Oct. 8, 2015

(30) Foreign Application Priority Data
Sep. 27, 2012 (EP) ................................. 12186405

(51) Int. Cl.
*H01L 21/20* (2006.01)
*H01L 31/0224* (2006.01)
(Continued)

(52) U.S. Cl.
CPC .. *H01L 31/022408* (2013.01); *H01L 31/03529* (2013.01); *H01L 31/103* (2013.01)

(58) Field of Classification Search
None
See application file for complete search history.

(56) References Cited

U.S. PATENT DOCUMENTS

| 6,586,789 | B1 | 7/2003 | Zhao |
| 7,312,484 | B1 | 12/2007 | Drowley et al. |

(Continued)

FOREIGN PATENT DOCUMENTS

| JP | H01216581 A | 8/1989 |
| JP | H10308507 A | 11/1998 |
| WO | 93/20588 A1 | 10/1993 |

OTHER PUBLICATIONS

Loukianova, N.V., et al., "Leakage Current Modeling of Test Structures for Characterization of Dark Current in CMOS Image Sensors", IEEE Transactions on Electron Devices, vol. 50(1), 2003, pp. 77-83.

(Continued)

*Primary Examiner* — Alexander Ghyka
(74) *Attorney, Agent, or Firm* — McDermott Will & Emery LLP

(57) ABSTRACT

The photodiode device comprises a doped region (2) contiguous with a contact region (3) of the same conductivity type located at the substrate surface (1'), an appertaining anode or cathode connection (7, 11), a further contact region (5) of an opposite conductivity type at the substrate surface, and a further anode or cathode connection (8, 12). The contact region (3) is arranged at least on opposite sides of an active area of the substrate surface that covers the further contact region (5). A lateral pn junction (16) and an associated space charge region is formed at the substrate surface by a boundary of one of the contact regions, the boundary facing the other contact region. A field electrode (6) is arranged above the lateral pn junction, separated from the lateral pn junction by a dielectric material (10), and is provided with a further electrical connection (9, 13) separate from the anode and cathode connections. By the field electrode (6), the space charge region at the surface (1') is reduced and the peripheral dark current of the photodiode decreases considerably.

12 Claims, 4 Drawing Sheets

(51) Int. Cl.
*H01L 31/103* (2006.01)
*H01L 31/0352* (2006.01)

(56) References Cited

U.S. PATENT DOCUMENTS

| | | | |
|---|---|---|---|
| 7,462,889 B2 * | 12/2008 | Yagyu | H01L 31/022416 257/183 |
| 7,701,030 B2 | 4/2010 | Roy | |
| 8,134,179 B2 | 3/2012 | Kraft et al. | |
| 2005/0156182 A1 * | 7/2005 | Hehemann | H01L 27/1463 257/82 |
| 2005/0156206 A1 | 7/2005 | Qiang et al. | |
| 2005/0167704 A1 * | 8/2005 | Ezaki | H01L 27/14603 257/233 |
| 2006/0017072 A1 | 1/2006 | Dosluoglu | |
| 2008/0061328 A1 | 3/2008 | Jang | |
| 2011/0278690 A1 * | 11/2011 | Bui | H01L 27/1446 257/432 |
| 2011/0291220 A1 * | 12/2011 | Yoshida | H01L 27/14609 257/461 |
| 2012/0032147 A1 * | 2/2012 | Nagai | A61B 5/14532 257/21 |
| 2012/0161267 A1 * | 6/2012 | Ezaki | H01L 27/14603 257/431 |
| 2012/0274771 A1 * | 11/2012 | Nagai | B82Y 20/00 348/148 |
| 2013/0119502 A1 * | 5/2013 | Hu | H01L 29/0646 257/443 |
| 2015/0125111 A1 * | 5/2015 | Orcutt | G02B 6/122 385/14 |

OTHER PUBLICATIONS

Martin-Gonthier, P., et al., "Evaluation of Radiation Hardness Design Techniques to Improve Radiation Tolerance for CMOS Image Sensors Dedicated to Space Appiications", Integrated Image Sensor Laboratory, SUPAERO, 2006, 19 pages, Toulouse-France.

* cited by examiner

PHOTODIODE DEVICE WITH REDUCIBLE SPACE CHARGE REGION

BACKGROUND OF THE INVENTION

A photodiode comprises a pn junction between semiconductor regions that are doped to have opposite types of electrical conductivity. A space charge region or depletion region forms at the pn junction. The extension of the space charge region and the strength of the electric field are increased by applying a bias voltage to the doped regions in the reverse direction, the voltage of the n-type region being positive with respect to the voltage of the p-type region.

When the photodiode is irradiated, electron-hole pairs are produced in the crystalline semiconductor material by lifting electrons from the valence band up into the conduction band, which allows a free movement of the electrons. The charge carriers thus generated in the space charge region produce a photocurrent, which can be detected in a control or read-out circuit connected to the photodiode. When the photodiode is not irradiated, the bias voltage generates a so-called dark current, which interferes with the measurement. The control circuit may be used to measure the dark current and to correct the measured value of the photocurrent accordingly.

U.S. Pat. No. 8,134,179 B2 discloses a photodiode comprising a pn junction between a doped region at the surface of a semiconductor substrate and a semiconductor layer of opposite type of conductivity arranged above the doped region. At the lateral margin of the doped region, a supplementary doping is applied to shift the pn junction and the space charge region to a position remote from the substrate surface. In this way charge carriers generated at crystalline defects near the substrate surface or at the edge of the doped region are prevented from contributing to the measured current.

U.S. Pat. No. 7,701,030 B2 describes a pinned photodiode formed by a region of n-type conductivity embedded in a region of p-type conductivity in a semiconductor substrate. The n-type region comprises a first zone and a second zone, which has a higher doping concentration and a smaller depth than the first zone. A shallow p+region is located at the surface above the n-type region. The doping concentrations are intended to deplete the n-type region during the operation of the device, which comprises an accumulation phase and a transfer phase. During the accumulation phase charge carriers are generated and stored in the n-type region; and in the transfer phase the charge carriers are driven through the transfer gate.

N. V. Loukianova et al., "Leakage current modeling of test structures for characterization of dark current in CMOS image sensors", IEEE Transactions on Electron Devices vol. 50(1), pages 77 to 83, 2003, describe a photodiode comprising an n-well that is surrounded by a p-well in order to reduce the dark current. The lateral pn junction is passivated by a shallow p+implant, reducing the width of the space charge region at the surface by one half.

U.S. Pat. No. 7,312,484 B1 describes a photodiode sensor structure with a pn junction between an n-type doped well region and a p-type substrate, which is the anode of the photodiode. An electric shield is formed by a polysilicon region over substantially all of the diode junction. A sense node contact forming a cathode is located at a drain/source connection region between a cascode transistor and a reset transistor.

SUMMARY OF THE INVENTION

The photodiode device can be operated in a way to reduce the dark current considerably.

The photodiode device comprises a substrate of semiconductor material having a surface, a doped region of a first type of electrical conductivity in the substrate, a contact region of the first type of electrical conductivity at the surface, the contact region being contiguous with the doped region and provided with an anode or cathode connection, and a further contact region of a second type of electrical conductivity that is opposite to the first type of electrical conductivity, the further contact region being arranged at the surface and provided with a further anode or cathode connection. The contact region is arranged at least on opposite sides of an area of the surface that is entirely formed by the semiconductor material of the substrate, this area covering the further contact region. A lateral pn junction is formed at the surface by a boundary of one of the contact regions, the boundary facing the other contact region. A field electrode is arranged above the lateral pn junction and is separated from the lateral pn junction by a dielectric material, and the field electrode is provided with a further electrical connection separate from the anode and cathode connections.

The first type of electrical conductivity may be n-type conductivity and the second type of electrical conductivity may be p-type conductivity, for instance. Instead, the types of conductivity can be reversed.

An embodiment of the photodiode device further comprises a further doped region in the substrate adjacent to the doped region, the further contact region being contiguous with the further doped region.

In a further embodiment the further doped region is of the second type of electrical conductivity, and the contact region extends into the further doped region.

In a further embodiment the further doped region is of the second type of electrical conductivity, the contact region extends into the further doped region, and the lateral pn junction is formed by a boundary between the contact region and the further doped region.

In a further embodiment the further doped region is of the second type of electrical conductivity and is a doped well embedded in semiconductor material of the first type of electrical conductivity.

In a further embodiment the further doped region is of the first type of electrical conductivity, and the lateral pn junction is formed by a boundary between the further contact region and the further doped region.

In further embodiments the doped region and the contact region surround the further doped region and/or the further contact region.

The dielectric material separating the field electrode from the lateral pn junction may be adapted for a voltage of at least 3 V applied between the field electrode and the contact region to reduce a lateral dimension of the space charge region or depletion region at the lateral pn junction to one third or less.

The following is a detailed description of examples of the photodiode in conjunction with the accompanying drawings.

DETAILED DESCRIPTION

Figure 1:
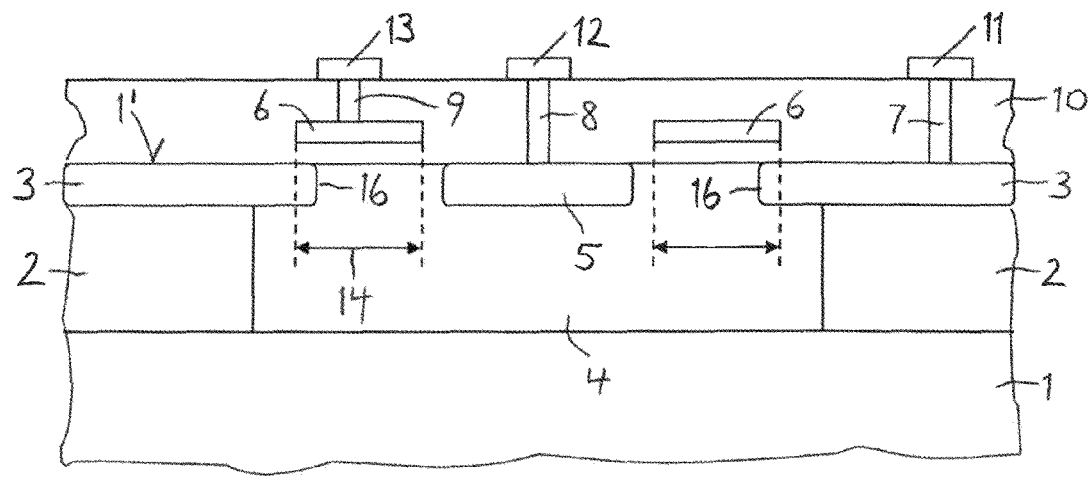
FIG. 1 shows a cross section of an embodiment of the photodiode device.

FIG. 1 shows a cross section of a photodiode device comprising a substrate 1 having a main upper surface 1', a doped region 2, a contact region 3, a further doped region 4, a further contact region 5, a field electrode 6 having a width 14, an anode or cathode plug 7, a further anode or cathode plug 8, a field electrode plug 9, dielectric material 10, an anode or cathode terminal 11, a further anode or cathode terminal 12, a field electrode terminal 13, and a lateral pn junction 16. The substrate 1 can be silicon, for instance, and can be provided with a basic doping for a first type of electrical conductivity. The doped region 2 of the first type of electrical conductivity surrounds a region that is provided for irradiation and generation of photocurrents. The contact region 3, which is arranged at the surface 1' of the substrate 1, contiguous with the doped region 2, is also doped for the first type of electrical conductivity but has a higher doping concentration than the doped region 2.

The contact region 3 is provided with an electrical connection. In the embodiment according to FIG. 1 the electrical connection includes an electrically conductive plug 7, which may be a metal, for example, and a terminal 11, which may be a contact pad, a conductor track or the like. A dielectric material 10 may be provided above the surface 1', particularly as an intermetal or interlayer dielectric for the accomodation of a wiring, and in this case the plug 7 connects the contact region 3 with the upper terminal 11 through the dielectric material 10. The doping concentration of the contact region 3 may be sufficiently high for the metal of the plug 7 to form an ohmic contact of appropriately low resistivity on the semiconductor material.

In the embodiment according to FIG. 1 a further doped region 4 is arranged adjacent to the doped region 2. The further doped region 4 has the opposite second type of electrical conductivity and forms pn junctions with the doped region 2 and with the contact region 3. If the substrate 1 has a basic doping for the first type of electrical conductivity, there is a pn junction also at the bottom of the further doped region 4. The doped region 2 and the further doped region 4 can be produced as doped wells by implantations of dopants, for example. The contact region 3 extends into the further doped region 4, so that a lateral pn junction 16 is present between the contact region 3 and the further doped region 4 at and immediately beneath the surface 1' of the substrate 1.

The further contact region 5 is doped for the opposite second type of electrical conductivity, and its doping concentration may be sufficiently high for the formation of an ohmic contact with an electrical connection, similarly to the doping concentration of the contact region 3. In the embodiment according to FIG. 1 the electrical connection of the further contact region 5 includes a further electrically conductive plug 8, which may comprise the kind of electrically conductive material used for the plug 7 on the contact region 3, and a further terminal 12, which may be a contact pad, a conductor track or the like.

If the first type of electrical conductivity is p-type conductivity and the second type of electrical conductivity is n-type conductivity, the plug 7 and the terminal 11 on the contact region 3 are the anode plug and the anode terminal, and the further plug 8 and the further terminal 12 on the further contact region 5 are the cathode plug and the cathode terminal. If the first type of electrical conductivity is n-type conductivity and the second type is p-type conductivity, the plug 7 and the terminal 11 are the cathode plug and the cathode terminal, and the further plug 8 and the further terminal 12 are the anode plug and the anode terminal.

The field electrode 6 is arranged above the lateral pn junction 16 and insulated from the semiconductor material by a thin layer of the dielectric material 10. The field electrode 6 is provided for a voltage to be applied between the field electrode 6 and the contact region 3. In the embodiment according to FIG. 1 the field electrode is in the shape of a ring or frame surrounding a central area, which may be occupied by the further contact region 5. The indicated width 14 of the field electrode 6 may be typically 0.6 µm, for example. If the field electrode 6 is a ring, the width 14 is the difference between the outer radius and the inner radius of the ring.

A space charge region or depletion region is formed in the vicinity of the pn junctions. Because of the different doping levels of the contact region 3 and the further doped region 4, the space charge region forming at the upper lateral pn junction 16 is mainly located in the further doped region 4. Therefore the field electrode 6 may be arranged above the lateral pn junction 16 and above an appropriate portion of the area between the contact region 3 and the further contact region 5. The field electrode 6 may cover the major portion of the area of the further doped region 4 outside the area of the further contact region 5 and may especially cover the entire area between the contact region 3 and the further contact region 5.

The field electrode 6 is arranged in such a way that a voltage of typically between 2 V and 5 V applied between the field electrode 6 and the contact region 3 reduces the dimension of the space charge region or depletion region in the direction parallel to the surface 1' and parallel to the plane of the drawing of FIG. 1 (i. e., in the direction of the double arrow indicating the width 14) to one third or less. The space charge region may thus be shrunk from typically about 0.7 µm to typically about 0.2 µm, for example.

When the voltage between the field electrode 6 and the contact region 3 is continuously increased to reach values of about 3 V to 4 V, the leakage current or dark current drops considerably, and the effect of the spatial reduction of the space charge region is demonstrated. The space charge region is reduced by bringing the junction, below and adjacent to the field electrode, to accumulation. If the first type of electrical conductivity is p-type conductivity and the second type of electrical conductivity is n-type conductivity, the voltage of the field electrode 6 should be positive with respect to the voltage of the contact region 3. If the first type of electrical conductivity is n-type conductivity and the second type of electrical conductivity is p-type conductivity, the voltage of the field electrode 6 should be negative with respect to the voltage of the contact region 3.

The dark current is further reduced when a variable voltage, typically a voltage that varies between −5 V and +5 V, for example, is applied to the field electrode 6. With an alternating voltage applied to the cathode, the leakage current decreases drastically to a zero current level. The reason for this drop of the leakage current is supposed to be related to the pinching of the space charge region at the diode periphery.

The field electrode 6, which may be a metal or polysilicon, for example, comprises an electrical connection separate from the anode and cathode connections. In the embodiment according to FIG. 1 the electrical connection of the field electrode 6 includes a further electrically conductive plug 9, which may comprise the kind of electrically conductive material used for the other plugs 7, 8, and a further terminal 13, which may be a contact pad, a conductor track or the like. If the field electrode 6 is polysilicon, it may be provided with a doping concentration that is sufficiently high to render the field electrode 6 electrically conductive and to form an ohmic contact with the plug 9.

Figure 2:
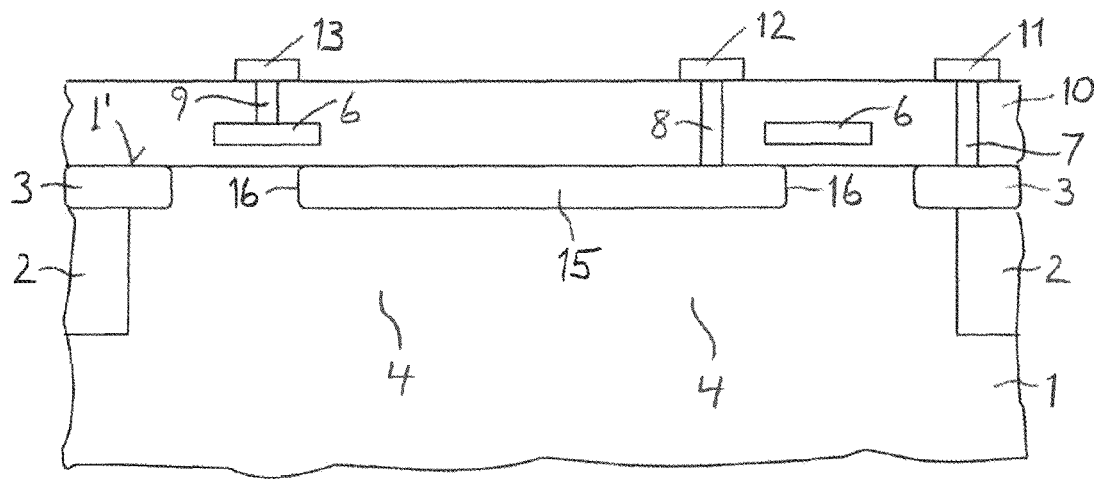
FIG. 2 shows a cross section of a further embodiment of the photodiode device.

FIG. 2 shows a cross section of a further photodiode device. The elements that correspond to elements of the embodiment according to FIG. 1 are designated with the same reference numerals. Instead of the further contact region 5, the embodiment according to FIG. 2 comprises an extended contact region 15, which is provided for a larger area of irradiation. This embodiment may therefore be especially suitable for a single photodiode, while the embodiment according to FIG. 1 may be especially suitable for each individual photodiode within an array of photodiodes.

In the embodiment according to FIG. 2 the further doped region 4 has the first type of electrical conductivity and may especially be formed by a part of the substrate 1, if the substrate 1 is provided with a basic doping of suitable concentration. The lateral pn junction 16 is formed at a boundary between the extended contact region 15 and the adjacent semiconductor material of opposite type of conductivity. This boundary faces the contact region 3 but is located at a distance from the contact region 3. The field electrode 6 is arranged above the lateral pn junction 16 and above a large portion or all of the area between the contact region 3 and the extended contact region 15. Apart from these differences the structure and operation of the embodiment according to FIG. 2 are similar to the structure and operation of the embodiment according to FIG. 1.

Figure 3:
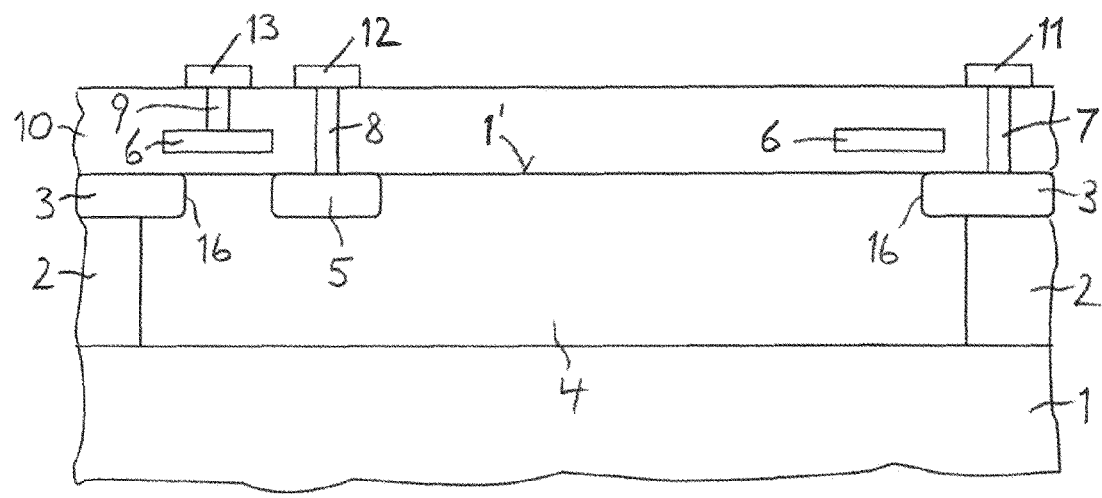
FIG. 3 shows a cross section of a further embodiment of the photodiode device.

FIG. 3 shows a cross section of a further photodiode device. The elements that correspond to elements of the embodiments according to FIGS. 1 and 2 are designated with the same reference numerals. The embodiment according to FIG. 3 differs from the embodiment according to FIG. 1 in that the further doped region 4 is larger and the further contact region 5 is located in the vicinity of the lateral boundary of the further doped region 4, thus keeping an area of irradiation free from the further contact region 5. The embodiment according to FIG. 3 is particularly suitable to cover a large radiation detection area.

Figure 4:
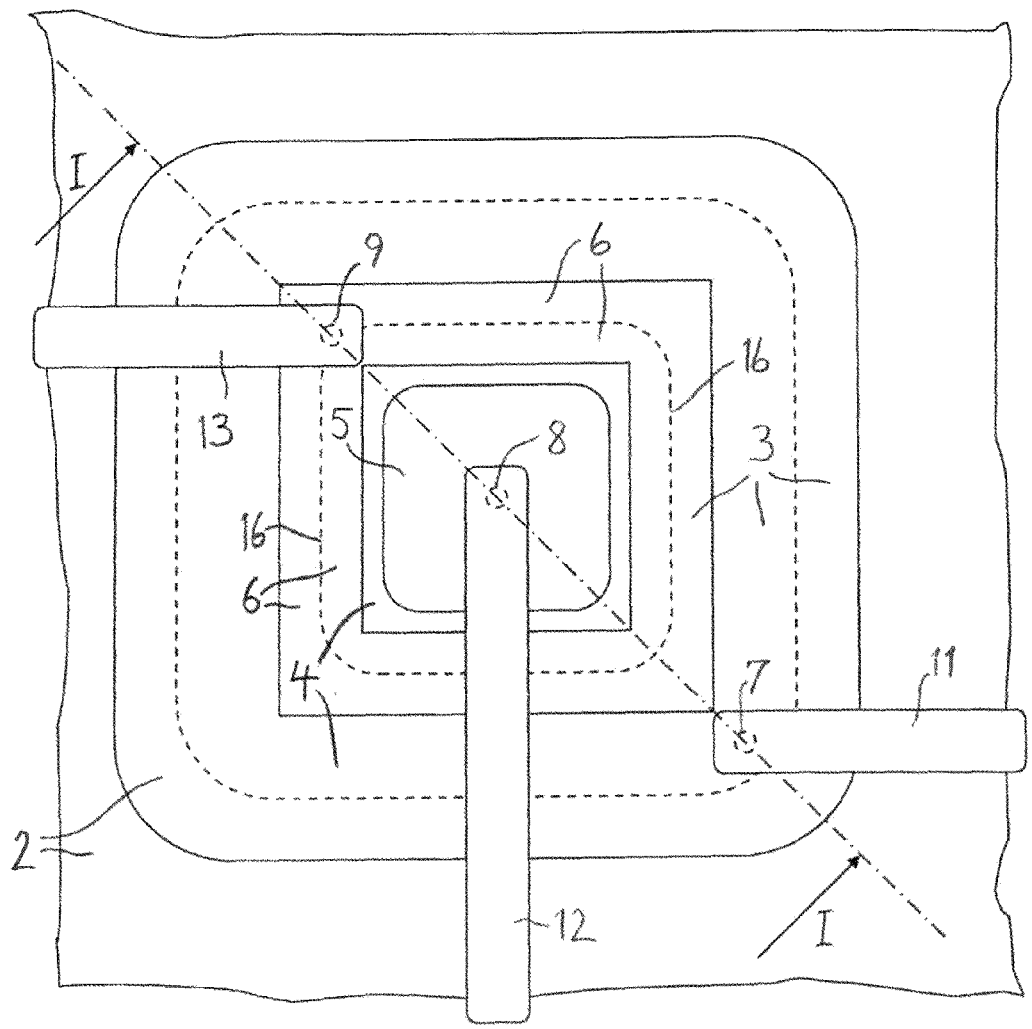
FIG. 4 shows a schematic plan view of an embodiment of the photodiode device.

FIG. 4 shows a schematic plan view of an embodiment of the photodiode device. A cross section along the straight broken line, viewed in the direction indicated by the arrows, corresponds to the cross section of FIG. 1 except for scales. The elements that correspond to elements of the embodiment according to FIG. 1 are designated with the same reference numerals. The terminals 11, 12, 13 are shown as conductor tracks arranged above the dielectric material 10, which is represented in FIG. 4 as if it were transparent to display the hidden contours. The field electrode 6 is represented as a rectangular framelike structure covering the lateral pn junction 16, which is shown by a broken line as hidden contour. The field electrode 6 covers a major portion of the area between the lateral pn junction 16 and the further contact region 5 located in the centre. The lateral pn junction 16 is formed at an inner lateral boundary of the contact region 3, which is not completely covered by the field electrode 6. A further broken line indicates the hidden contour of the boundary between the doped region 2 and the further doped region 4. The shapes and dimensions of the anode, cathode and field electrode plugs 7, 8, 9 and the anode, cathode and field electrode terminals 11, 12, 13 may be varied. Furthermore there may be more than one electrical anode, cathode and/or field electrode connection, particularly for applications requiring a reduction of the current paths and resistances.

Figure 5:
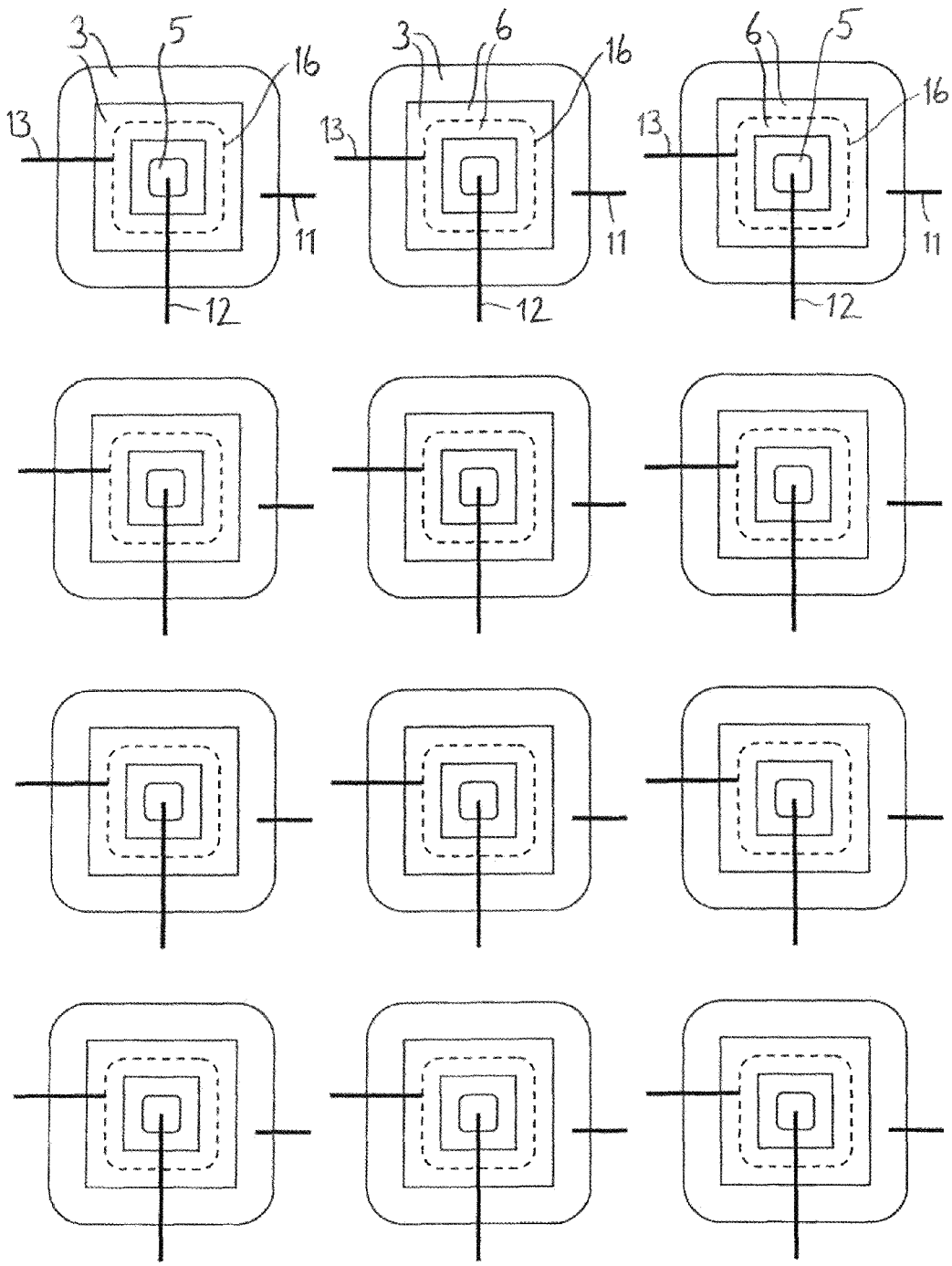
FIG. 5 shows a schematic plan view of a further embodiment comprising a plurality of photodiodes.

FIG. 5 shows a schematic plan view of an array of embodiments of the photodiode device according to FIGS. 1 and 4. A plurality of photodiodes are arranged in a regular pattern forming a matrix of pixels, which may be used as an image sensor, for instance. The arrangement shown in FIG. 5 is only one example, which may be modified according to individual requirements. In FIG. 5 the photodiodes are represented by their further contact regions 5, surrounded by outlines of the field electrodes 6, covering the lateral pn junctions 16 located at the inner boundaries of the contact regions 3. The arrangement of the further contact regions 5 at the centres of the photodiodes may facilitate the integration of a large number of miniature photodiodes, but it is not necessary. The further contact regions 5 may instead be arranged according to the embodiments shown in FIGS. 2 and 3, which may also be used to form arrays. The terminals 11, 12, 13 are represented as conductor tracks, but may instead be contact pads, for instance. A wiring may be provided to enable a selection of rows and columns of the array in a way known per se from conventional photodiode arrays.

The described photodiode device is based on an electrical control of the space charge region at the surface of the semiconductor substrate by means of the field electrode 6. When the lateral extension of the space charge region at the surface 1' is reduced, the peripheral dark current of the photodiode decreases considerably. The shrinkage of the space charge region is caused by an accumulation of free charge carriers injected from the further doped region 4. With no biasing voltage applied to the field electrode 6, electrons and holes travel between the contact region 3 and the further doped region 4 until the electric field yields an equilibrium, and a space charge region is generated. When the field electrode 6 is biased, charge carriers are induced in the semiconductor material below the field electrode 6. The induced charge carriers recombine with charge carriers of the opposite sign, so that the lateral dimension of the space charge region is decreased.

The photodiode device avoids an application of insulating regions like field oxide regions at the substrate surface within the area of the photodiode, especially in the area that is provided for irradiation. Dislocations and stress in the semiconductor material arising from oxide regions are thus avoided, and the absence of oxide regions also enhances the radiation tolerance. The photodiode device is fully compatible with standard CMOS processes, especially if the field electrode is formed from doped polysilicon, so that a control or read-out circuit can be monolithically integrated with the photodiode.

The invention claimed is:

1. A photodiode device, comprising:
   a substrate of semiconductor material having a surface and an area of the surface that is entirely formed by the semiconductor material;
   a doped region of a first type of electrical conductivity in the substrate;
   a contact region of the first type of electrical conductivity at the surface, the contact region being contiguous with the doped region and provided with an anode or cathode connection;
   a further contact region of a second type of electrical conductivity that is opposite to the first type of electrical conductivity, the further contact region being arranged at the surface and provided with a further anode or cathode connection;
   the contact region being arranged at least on opposite sides of the area of the surface that is entirely formed by the semiconductor material of the substrate, this area covering the further contact region;

a lateral pn junction being formed at the surface by a boundary of one of the contact regions, the boundary facing the other contact region;

a field electrode being arranged above the lateral pn junction and being separated from the lateral pn junction by a dielectric material; and the field electrode being provided with a further electrical connection separate from the anode and cathode connections.

2. The photodiode device according to claim 1, further comprising:

a further doped region in the substrate adjacent to the doped region, the further contact region being contiguous with the further doped region.

3. The photodiode device according to claim 2, wherein the further doped region is of the second type of electrical conductivity, and the contact region extends into the further doped region.

4. The photodiode device according to claim 3, wherein the lateral pn junction is formed by a boundary between the contact region and the further doped region.

5. The photodiode device according to claim 3, wherein the further doped region is a doped well embedded in semiconductor material of the first type of electrical conductivity.

6. The photodiode device according to claim 2, wherein the further doped region is of the first type of electrical conductivity, and the lateral pn junction is formed by a boundary between the further contact region and the further doped region.

7. The photodiode device according to claim 2, wherein the doped region and the contact region surround the further doped region.

8. The photodiode device according to claim 1, wherein the doped region and the contact region surround the further contact region.

9. The photodiode device according to claim 1, wherein the dielectric material separating the field electrode from the lateral pn junction is adapted for a voltage of at least 3 V applied between the field electrode and the contact region to reduce a lateral dimension of a space charge region or depletion region at the lateral pn junction to one third or less.

10. The photodiode device according to claim 1, wherein the first type of electrical conductivity is
n-type conductivity and the second type of electrical conductivity is p-type conductivity.

11. The photodiode device according to claim 1, wherein the first type of electrical conductivity is
p-type conductivity and the second type of electrical conductivity is n-type conductivity.

12. A photodiode device, comprising:

a substrate of semiconductor material having a surface and an area of the surface that is entirely formed by the semiconductor material;

a doped region of a first type of electrical conductivity in the substrate;

a contact region of the first type of electrical conductivity at the surface, the contact region being contiguous with the doped region and provided with an anode or cathode connection;

a further contact region of a second type of electrical conductivity that is opposite to the first type of electrical conductivity, the further contact region being arranged at the surface and provided with a further anode or cathode connection;

the contact region being arranged at least on opposite sides of the area of the surface that is entirely formed by the semiconductor material of the substrate, this area covering the further contact region;

a further doped region of the second type of electrical conductivity arranged in the substrate adjacent to the doped region, the contact region extending into the further doped region, and the further contact region being contiguous with the further doped region;

a lateral pn junction formed at the surface by a boundary between the contact region and the further doped region;

a field electrode being arranged above the lateral pn junction and being separated from the lateral pn junction by a dielectric material; and the field electrode being provided with a further electrical connection separate from the anode and cathode connections.

* * * * *